US008729399B2

(12) United States Patent
Huang et al.

(10) Patent No.: US 8,729,399 B2
(45) Date of Patent: May 20, 2014

(54) FLAT CABLE AND METHOD FOR FABRICATING THE SAME

(75) Inventors: Detian Huang, Hitachi (JP); Takanobu Watanabe, Hitachi (JP); Noriyuki Imai, Hitachi (JP); Norihiro Nishiura, Hitachi (JP)

(73) Assignee: Hitachi Metals, Ltd., Tokyo (JP)

(*) Notice: Subject to any disclaimer, the term of this patent is extended or adjusted under 35 U.S.C. 154(b) by 562 days.

(21) Appl. No.: 12/912,123

(22) Filed: Oct. 26, 2010

(65) Prior Publication Data

US 2011/0290526 A1 Dec. 1, 2011

(30) Foreign Application Priority Data

May 31, 2010 (JP) ................................ 2010-124787

(51) Int. Cl.
*H05K 1/00* (2006.01)

(52) U.S. Cl.
USPC ........................................ 174/254; 174/117 F

(58) Field of Classification Search
None
See application file for complete search history.

(56) References Cited

U.S. PATENT DOCUMENTS

| | | | | | |
|---|---|---|---|---|---|
| 3,654,381 | A * | 4/1972 | Copp | ......................... | 174/117 F |
| 4,463,323 | A * | 7/1984 | Piper | ................................ | 333/1 |
| 4,956,524 | A * | 9/1990 | Karkow | .................. | 174/117 M |
| 6,139,954 | A * | 10/2000 | Dean et al. | .................... | 428/373 |
| 6,503,623 | B1 * | 1/2003 | Oue et al. | ...................... | 428/364 |
| 6,926,962 | B2 * | 8/2005 | Yamazaki et al. | ............ | 428/395 |
| 7,601,656 | B2 * | 10/2009 | Horiguchi et al. | ............ | 442/268 |
| 8,367,932 | B2 * | 2/2013 | Matsumoto | ............... | 174/110 R |
| 2010/0089610 | A1 | 4/2010 | Matsumoto | | |

FOREIGN PATENT DOCUMENTS

| | | |
|---|---|---|
| JP | 2001-101934 | 4/2001 |
| JP | 2008-235024 | 10/2008 |

* cited by examiner

*Primary Examiner* — Ishwarbhai B Patel
(74) *Attorney, Agent, or Firm* — Scully, Scott, Murphy & Presser, P.C.

(57) ABSTRACT

A flat cable has a plurality of electric wires disposed in parallel, and a fiber member woven to thread through each of the electric wires along a juxtapositional direction of the electric wires. The fiber member is made of a fiber having an elastic recovery rate after elongation of 80% or more and 95% or less. The fiber has an initial modulus of 20 cN/dtex or more and 30 cN/dtex or less.

8 Claims, 2 Drawing Sheets

FLAT CABLE AND METHOD FOR FABRICATING THE SAME

The present application is based on Japanese Patent Application No. 2010-124787 filed on May 31, 2010, the entire contents of which are incorporated herein by reference.

BACKGROUND OF THE INVENTION

1. Field of the Invention

The invention relates to a flat cable to be used in a narrow movable part which involves sliding operation or the like of an electronic device such as mobile phone or laptop computer, and a method for fabricating the same.

2. Prior Art

In the electronic devices such as mobile phone, laptop computer, and portable data communication terminal (PDA: Personal Digital Assistant), a connecting part for connecting a main body for operating the electronic device and a display part such as liquid crystal display is often configured to have a foldable structure (openable and closable type structure). In the connecting part having the aforementioned structure, as a wiring material for signal transmission for connecting the main body and the display part, a flexible printed circuit (FPC) has been often used, since the FPC is relatively flexible and can be disposed within a flat and thin type electronic device.

As a cabling material alternative to FPC, there is a flat cable formed by laying flatly a plurality of narrow wires (e.g. coaxial cables), and then weaving polyester fiber members to thread into each of the flatly laid wires along a direction substantially perpendicular to a longitudinal direction of the flatly laid wires (see Patent Document 1 and 2, for example). For example, JP-A 2001-101934 and JP-A 2008-235024 disclose such conventional flat cables.

SUMMARY OF THE INVENTION

As described above, the electronic devices recently used are often configured in such a manner that the display part is rotatable or twistable with respect to the main body as an axis of the connecting part or in such a manner that the display part is slidable with respect to the main body. Moreover, as recent electronic devices are facing rapidly growing demands for making their main bodies even thinner, a thinner wiring space is demanded for a wiring material disposed between the display part and the main body. Therefore, the wiring material is installed in a wiring space with a height of about less than 5.0 mm, and the wiring material operates with sliding or the like in the wiring space within the aforementioned height range, when the electronic device is in operation.

However, as for the conventional flat cables as disclosed by JP-A 2001-101934 and JP-A 2008-235024, resistance to the operation involving with the sliding operation is insufficient, since the operation involving with the slide operation is not taken into consideration. For this reason, it is difficult to be used in the wiring space with the abovementioned height. Even though wiring is possible, there is a problem that an operation such as sliding cannot be carried out smoothly.

Accordingly, an object of the present invention is to provide a flat cable and a method for fabricating the same, which can be installed in a very narrow wiring space, and has excellent resistance property against the operation which involves sliding or the like.

According to a feature of the present invention, a flat cable comprises:

a plurality of electric wires disposed in parallel; and a fiber member woven to thread through each of the electric wires along a juxtapositional direction of the electric wires, in which the fiber member comprises a fiber having an elastic recovery rate after elongation of 80% or more and 95% or less.

The fiber preferably has an initial modulus of 20 cN/dtex or more and 30 cN/dtex or less.

The fiber preferably comprises polytrimethylene terephthalate.

The fiber member preferably comprises a plurality of fibers bundled together.

The fiber member is preferably woven such that a weaving pitch between electric wires placed in a center portion is larger than a weaving pitch between electric wires placed in a peripheral portion in the juxtapositional direction of the electric wires.

The fiber member is preferably woven to thread through at least two electric wires as one unit in the center portion of a width direction of a main body of the flat cable.

The fiber member is preferably woven to thread through every single electric wire as one unit in the peripheral portion of a width direction of a main body of the flat cable.

According to another feature of the invention, a method for fabricating a flat cable comprising a plurality of electric wires disposed in parallel, and a fiber member woven to thread through each of the electric wires along a juxtapositional direction of the electric wires, the method comprises:

disposing a plurality of electric wires in parallel;

weaving a fiber member comprising a fiber having an elastic recovery rate after elongation of 80% or more and 95% or less to each of the electric wires along a juxtapositional direction of the electric wires; and heating the fiber member.

The step of heating the fiber member is preferably conducted by heating the fiber member while a surface of the fiber member contains moisture.

The step of heating the fiber member is preferably conducted at a temperature of 100° C. or more and 120° C. or less.

Effects of the Invention

According to the present invention, it is possible to provide a flat cable and a method for fabricating the same, which can be installed in a very narrow wiring space, and has excellent resistance property against the operation which involves sliding or the like.

BRIEF DESCRIPTION OF DRAWINGS

Next, embodiments according to the invention will be explained in conjunction with appended drawings, wherein.

DETAILED DESCRIPTION OF THE PREFERRED EMBODIMENT

Next, the embodiment according to the present invention will be explained in more detail in conjunction with the appended drawings.

Figure 1:
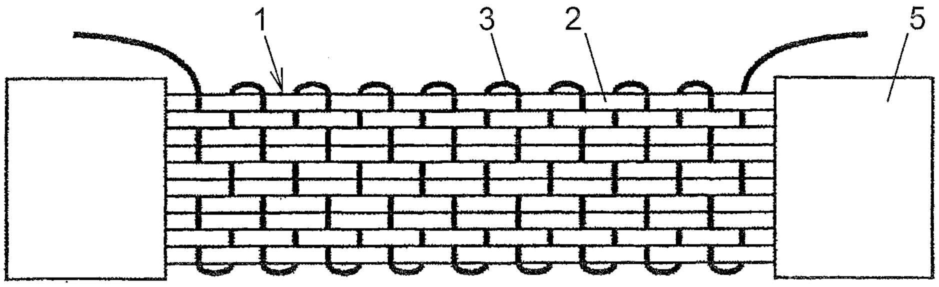
FIG. 1 is a plan view of a harness using a flat cable in one embodiment according to the present invention.

FIG. 1 is a plan view of a harness using a flat cable in one embodiment according to the present invention.

(Total Structure of a Flat Cable 1)

Referring to FIG. 1, a flat cable 1 comprises a plurality of electric wires 2 arranged in geometrically parallel (i.e. juxtaposed), and a fiber member 3 which is woven along a juxtapositional direction of the electric wires 2 (i.e. a direction substantially perpendicular to a longitudinal direction of the electric wires 2) to thread through a plurality of the electric wires 2.

(Fabrication Method of the Flat Cable 1)

The flat cable 1 is fabricated by a fabrication method comprising a step of arranging a plurality of the electric wires 2 in geometrically parallel (i.e. juxtaposing the electric wires 2), a step of weaving a fiber member 3 comprising a fiber having an elastic recovery rate after elongation of 80% or more and 95% or less along a juxtapositional direction of the electric wires 2 to thread through a plurality of the electric wires 2, and a step of heating the fiber member 3.

The step of heating the fiber member 3 is conducted, for example, at a temperature of 100° C. or more and 120° C. or less. At this point, heat treatment of the fiber member 3 is preferably conducted at the temperature of 100° C. or more and 120° C. or less while a surface of the fiber member 3 contains moisture.

(Heat Treatment of the Fiber Member 3)

As to a method of heat treatment for obtaining the flat cable 1, following methods may be used. For example, the fiber member 3 may be heated by treating a flat cable main body comprising the fiber member 3 woven into the electric wires 2 to make the surface of the fiber member 3 contain moisture, and moving a heating roller which is heated at the temperature of 100° C. or more and 120° C. or less along the longitudinal direction of the flat cable main body to be placed along the surface of the fiber member 3. Alternatively, the fiber member 3 may be heated by placing the flat cable main body in a heating apparatus such as thermostatic chamber and heating the fiber member 3 at the temperature of 100° C. or more and 120° C. while spraying vapor (steam) etc. on the surface of the fiber member 3, to make the surface of the fiber member 3 contain moisture. In such heat treatment method, the fiber member 3 may be heated while the surface of the fiber member 3 contains moisture by using the heating roller having a function of spraying vapor. According to this heat treatment, the fiber member 3 is contracted so that each of the electric wires 2 is kept being neatly arranged. Through such heat treatment, a width of the flat cable main body is contracted in a range e.g. from about 15 mm to about 11 mm so that the flat cable 1 is provided.

(Structure of the Electric Wire 2)

Each of the electric wires 2 comprises a coaxial cable comprising, for example, an inner conductor formed of a plurality of copper wires stranded together, an insulator formed at an outer periphery of the inner conductor, an outer conductor formed by spirally wrapping a plurality of conductors at an outer periphery of the insulator, and a jacket formed at an outer periphery of the outer conductor. Herein, each of the insulator and the jacket comprises fluororesin such as tetrafluoroethylene perfluoroalkyl vinyl ether copolymer (PFA), tetrafluoroethylene hexafluoropropylene copolymer (FEP), and ethylene tetrafluoroethylene copolymer (ETFE), or PET. The outer conductor is formed by using a conductor (a single wire or a stranded wire) comprising a metal wire (including a surface plated wire) such as a soft copper wire.

An outer diameter of each of the electric wires 2 is preferably 0.35 mm or less, considering that they are put through a connecting part of mobile phone, laptop computer or personal digital assistant (PDA).

(Weaving of the Fiber Member 3)

The fiber member 3 is woven to thread through each of the electric wires 2 from one end of the flat cable in the longitudinal direction to another end (from left side to right side in FIG. 1), shuttling back and forth in zigzag, while flatly securing a plurality of the electric wires 2 in the longitudinal direction.

At this point, the fiber member 3 is preferably woven in a juxtapositional direction (a vertical direction in FIG. 1) of the electric wires 2 so as to make a weaving pitch between the electric wires 2 located in a center portion larger than that between the electric wires 2 located at end parts (peripheral portions). The weaving pitch refers to a distance traveled at one side of the flat cable 1 when the fiber 3 shuttles back and forth from one side to another side and then back to the one side of the flat cable 1. For example, the fiber member 3 is woven in the center portion in the width direction of the flat cable 1 (the juxtapositional direction of the electric wires 2) to thread through units each of which is made of at least two (two in FIG. 1) of the electric wires 2, and at the ends in the width direction of the flat cable 1 to thread through units each of which is made of one of the electric wires 2.

The center portion in the width direction of the flat cable 1 is not limited to a center axis of the flat cable 1, and may include portions in the vicinity of the center axis. Also, the ends in the width direction of the flat cable 1 are not limited to outermost positions in the width direction of the flat cable 1, and may include portions in the vicinity of the outermost positions.

According to such a configuration, a suitable rigidity can be given in the center portion of the flat cable 1 when the flat cable 1 is bent. Consequently, when the flat cable 1 is bent and slid, straight forwarding property for following the slide can be given to the flat cable 1. Further, compared with the case when the fiber member 3 is woven to thread through the units each of which is made of one of the electric wires 2, the number of times that the fiber member 3 is woven can be reduced, and the width of the flat cable 1 can be decreased simultaneously.

In addition, according to such a configuration, breakage or the like of the electric wires 2 can be prevented when the flat cable 1 is bent and slid, since stress can be effectively released by moving the electric wires 2 in the width direction of the flat cable 1 at a bent portion.

Although the fiber member 3 is woven over an entire length of the flat cable 1, the fiber member 3 at the both ends in the longitudinal direction of the flat cable 1 is removed for the ease of attaching connectors 5.

A weaving density of the fiber member 3 is preferably constant over the entire length of the flat cable 1, or coarser at the end parts than in the center portion in the longitudinal direction of the flat cable 1. By making the weaving density of the fiber member 3 coarser at the end parts than in the center portion in the longitudinal direction of the flat cable 1, a shape of the flat cable 1 is held flat, and operation for removing the fiber member 3 can be made easier when the connectors 5 are attached. In addition, it is possible to improve bending resistance property and sliding resistance property of the center portion of the flat cable 1, which is repeatedly subject to bends or slides.

(Modulus and Elastic Recovery Rate after Elongation of the Fiber Member 3)

The flat cable 1 is made by arranging a plurality of the electric wires 2 in juxtaposition, weaving the fiber member 3 to thread through a plurality of the electric wires 2 to make a flat cable main body, and shrinking the fiber member 3 by heat treatment. For the fiber member 3, a fiber having an initial modulus of 20 centi-Newton/deci-tex (cN/dtex) or more and 30 cN/dtex or less and an elastic recovery rate after elongation of 80% or more and 95% or less is used.

Thus, by setting the initial modulus of the fiber member 3 to be 20 cN/dtex or more and 30 cN/dtex or less, the fiber member 3 can be woven without burdening the electric wires 2 in weaving. The reasons for using the fiber member 3 comprising the fiber having the initial modulus of 20 cN/dtex or more and 30 cN/dtex or less are given below.

If the fiber member 3 comprises a fiber having a modulus of less than 20 cN/dtex, a tightening force against the electric wires 2 on weaving the fiber member 3 will be decreased and the flat cable 1 will not be made into a neat shape. As a result, it will be necessary to provide a separate process of adjusting the shape of the fiber member 3 neatly after weaving. Consequently, the manufacturing cost increases.

If the fiber member 3 comprises a fiber having a modulus of more than 30 cN/dtex, the tightening force against the electric wires 2 on weaving the fiber member 3 will be increased, so that the electric wires 2 will undulate when the fiber member 3 is woven to thread through the electric wires 2. Consequently, the characteristics of the flat cable 1 will be deteriorated.

Namely, since the electric wire is deformed to undulate, for example, operation for connecting a conductor with a connector-side electrode connected to the conductor becomes troublesome, so that workability will be deteriorated. In addition, degradation of a transmission characteristic will be caused due to variation in the characteristic impedance of the electric wire.

For these reasons, the fiber member 3 comprises a fiber having the initial modulus of 20 cN/dtex or more and 30 cN/dtex or less.

On the other hand, the reason for providing the fiber member 3 comprising the fiber having the elastic recovery rate after elongation of 80% or more and 95% or less is as follows.

If the fiber member 3 comprises a fiber having an elastic recovery rate after elongation of less than 80%, elasticity of the fiber member 3 is insufficient when the flat cable 1 is bent and slid, and breaking of the wires due to the slide tends to occur. If the fiber member 3 comprises a fiber having an elastic recovery rate after elongation of more than 95%, the contracting force of the fiber member 3 when the flat cable 1 is bent and slid is reduced. Consequently, the surface of the electric wires 2 is easily exposed from a gap between adjacent woofs of the fiber member 3, and the exposed electric wires 2 are possibly broken.

(Measurement of the Elastic Recovery Rate after Elongation)

The elastic recovery rate after elongation is measured in accordance with JIS L 1096 as follows. A test piece comprising a woven fiber member 3 and having a width of 5 cm and a length of 30 cm is prepared. An upper side of one end of the test piece is secured with a clip and an initial load is given on another end of the test piece. Herein, two points distant with an interval of 20 cm are marked. Then, a load of 1.5 kg is given instead of the initial load, and a distance L1 between the two marks after an hour is measured. After removing the load, a distance L2 between the two marks an hour after the initial load is given is measured. The elastic recovery rate after elongation is obtained by the following formula (1):

$$\text{Elastic recovery rate after elongation}=(L1-L2)/(L1-20)\times 100 \quad (1)$$

By using the fiber member 3 as described above, the elasticity can be given to the width direction of the flat cable 1. Therefore, the stress applied to the flat cable 1 when the flat cable 1 is bent and slid in a wiring space with an extremely small height can be effectively released in the width direction of the flat cable 1. Consequently, since the electric wires 2 can be moved in the width direction of the flat cable 1 when the flat cable 1 is bent and slid, the stress applied to the electric wires 2 is relaxed even though the flat cable 1 is bent and slid in the wiring space with the extremely small height. Therefore, breaking of the electric wires 2 can be prevented Further, since the elasticity can be given to the width direction of the flat cable 1, it is possible to install the flat cable 1 in a shape suitable to the wiring space along the longitudinal direction of the flat cable 1.

The fiber member 3 is preferably formed by bundling a plurality of fibers. As a fiber for the fiber member 3, fibers such as polytrimethylene terephthalate (PTT) made from a condensation polymer of 1,3-propanediol and terephthalic acid (e.g. Solotex (registered trademark) by Solotex Corporation, T400 by Toray Opelontex Co., Ltd. etc.). By using the fiber member 3 formed of bundling a plurality of fibers, the stress applied to the electric wires 2 when the flat cable 1 is bent and slid can be relaxed compared with the case where the fiber member composed of a single fiber is used. Consequently, resistance to operations such as slide can be improved.

As described above, by configuring a flat cable to comprise a plurality of electric wires disposed in parallel, and a fiber member woven to thread through each of the electric wires along a juxtapositional direction of the electric wires, in which the fiber member comprises a fiber having an elastic recovery rate after elongation of 80% or more and 95% or less, it is possible to provide a flat cable, which can be installed in a very narrow wiring space, and has excellent resistance property against the operation such as sliding.

EXAMPLES

Next, Examples of the embodiment of the invention will be described below. In the Examples, a slide characteristic of the flat cable is evaluated in accordance with the following method.

Firstly, a flat cable specimen 20 having a thickness of 0.4 mm and a width of 12 mm was fabricated by weaving a fiber member with an elastic recovery rate after elongation shown in TABLE 1 to thread through forty wires, each of which comprises a coaxial cable with a fluororesin jacket and has an outside diameter of 0.21 mm.

Figure 2:
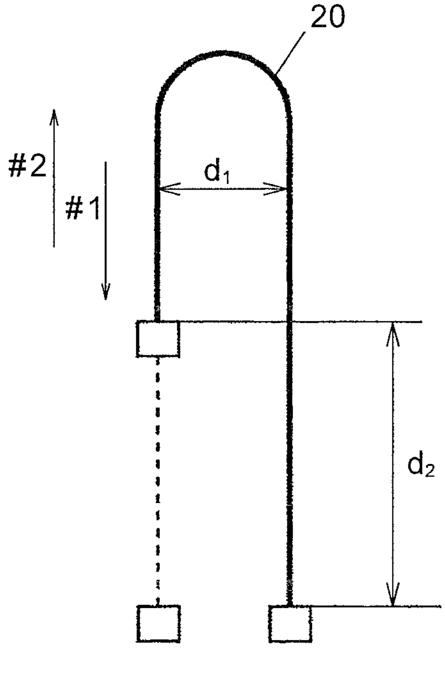
FIG. 2 is an explanatory diagram showing a slide test method for comparing comparative examples and Examples in the embodiment according to the present invention.
Figure 3:
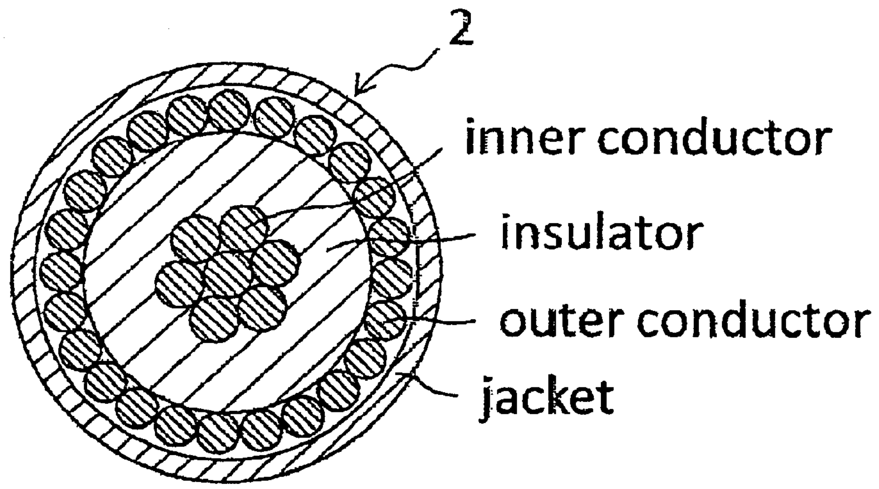
FIG. 3 is a sectional view of an electric wire in the embodiment according to the present invention.

Next, after the flat cable specimen thus fabricated was placed within a wiring space having a height of about 4.0 mm. Then, as shown in FIG. 2, one end of the flat cable specimen 20 was secured while an operation of U-shape sliding was conducted at another end by bending the flat cable specimen 20 along a direction perpendicular to a width direction at an interval of 3.0 mm between the flat cable specimen 20 and with a stroke length of 60 mm. The U-shape sliding was conducted as one cycle by arrow 1 and arrow 2 in this order.

As for a test speed, the number of cycles conducted in a unit time was 30 per minute. Further, a voltage V was constantly applied to the flat cable specimen and a point when an electric current value dropped by 20% compared with a starting point of the test was regarded as lifetime of the flat cable specimen.

According to the above method, the number of cycles when the lifetime of the flat cable specimen comes to an end was obtained. TABLE 1 shows the measurement results.

TABLE 1

| | Comparative Example 1 | Example 1 | Example 2 | Example 3 | Example 4 | Comparative Example 2 |
|---|---|---|---|---|---|---|
| Elastic recovery rate after elongation of fiber member | 75% | 80% | 85% | 90% | 95% | 100% |
| Outer diameter of coaxial cable | 0.21 mm | 0.21 mm | 0.21 mm | 0.21 mm | 0.21 mm | 0.21 mm |
| Thickness of flat cable | 0.4 mm | 0.4 mm | 0.4 mm | 0.4 mm | 0.4 mm | 0.4 mm |
| Width of flat cable | 12 mm | 12 mm | 12 mm | 12 mm | 12 mm | 12 mm |
| Height of wiring space | 4.0 mm | 4.0 mm | 4.0 mm | 4.0 mm | 4.0 mm | 4.0 mm |
| Slide characteristic | X | ○ | ○ | ○ | ○ | X |

In the test, "200,000 cycles and more" was evaluated as "○: acceptable" and "less than 200,000 cycles" was evaluated as "x: unacceptable".

As shown in TABLE 1, in Examples 1 to 4 where the elastic recovery rate after elongation of the fiber member is 80% or more and 95% or less, the number of slides proves to be 200,000 or more.

On the other hand, in the comparative example 1, where the elastic recovery rate after elongation is 75%, the number of slides is less than 200,000. The reason for this is considered as follows. If the elastic recovery rate after elongation of the fiber member is less than 80%, the tightening force against the electric wires becomes stronger when the electric wires are bent by the sliding operation. Then, the bending stress is concentrated on the electric wires and the breaking occurs due to fatigue.

Further, in the comparative example 2, where the elastic recovery rate after elongation is 100%, the number of slides is also less than 200,000. The reason for this is considered as follows. If the elastic recovery rate after elongation of the fiber member is more than 95%, the tightening force against the electric wires will be reduced when the electric wires are bent by the slide. Then, the surface of the electric wires is easily exposed from the gap between the woofs of the fiber member and the breaking occurs when the slide operation cannot be carried out smoothly after a certain number of slides are given.

Therefore, the elastic recovery rate after elongation is preferably 80% or more and 95% or less. The reason for this is considered as follows. Within this range, the tightening force against the electric wires in the width direction of the flat cable is well-balanced with a force by elastic expansion of the fiber member to release bending stress. Thus, the flat cable which is highly resistant to operations such as slide can be obtained.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. A flat cable comprising:

a plurality of electric wires disposed in parallel; and a fiber member woven to thread through each of the electric wires along a juxtapositional direction of the electric wires, wherein the fiber member comprises a fiber having an elastic recovery rate after elongation of 80% or more and 95% or less, wherein the fiber has an initial modulus of 20 cN/dtex or more and 30 cN/dtex or less, and wherein the plurality of electric wires are devoid of undulation.

2. The flat cable according to claim 1, wherein the fiber comprises polytrimethylene terephthalate.

3. The flat cable according to claim 1, wherein the fiber member comprises a plurality of fibers bundled together.

4. The flat cable according to claim 1, wherein the fiber member is woven such that a weaving pitch between electric wires placed in a center portion is larger than a weaving pitch between electric wires placed in a peripheral portion in the juxtapositional direction of the electric wires.

5. The flat cable according to claim 4, wherein:

the center portion includes a center axis of the flat cable and portions in a width direction of the flat cable in the vicinity of the center axis, and the peripheral portion includes outermost positions in the width direction of the flat cable and portions in the vicinity of the outermost positions.

6. The flat cable according to claim 1, wherein the fiber member is woven to thread through at least two electric wires as one unit in the center portion of a width direction of a main body of the flat cable.

7. The flat cable according to claim 1, wherein the fiber member is woven to thread through every single electric wire as one unit in the peripheral portion of a width direction of a main body of the flat cable.

8. The flat cable according to claim 1, wherein each of the electric wires comprises a coaxial cable comprising:

an inner conductor formed of a plurality of copper wires stranded together;

an insulator formed at an outer periphery of the inner conductor;

an outer conductor formed by spirally wrapping a plurality of conductors at an outer periphery of the insulator; and a jacket formed at an outer periphery of the outer conductor.

* * * * *